(12) United States Patent
White

(10) Patent No.: US 10,541,348 B2
(45) Date of Patent: Jan. 21, 2020

(54) QUANTUM DOT PHOTODETECTOR APPARATUS AND ASSOCIATED METHODS

(71) Applicant: LytEn, Inc., Sunnyvale, CA (US)

(72) Inventor: Richard White, Huntington (GB)

(73) Assignee: LYTEN, INC., Sunnyvale, CA (US)

(*) Notice: Subject to any disclaimer, the term of this patent is extended or adjusted under 35 U.S.C. 154(b) by 0 days.

(21) Appl. No.: 15/779,015

(22) PCT Filed: Mar. 17, 2017

(86) PCT No.: PCT/FI2017/050182
§ 371 (c)(1),
(2) Date: May 24, 2018

(87) PCT Pub. No.: WO2017/162913
PCT Pub. Date: Sep. 28, 2017

(65) Prior Publication Data
US 2019/0019913 A1  Jan. 17, 2019

(30) Foreign Application Priority Data
Mar. 24, 2016 (EP) .................................... 16162244

(51) Int. Cl.
*H01L 31/0352* (2006.01)
*H01L 31/113* (2006.01)
(Continued)

(52) U.S. Cl.
CPC .............. *H01L 31/113* (2013.01); *G01J 1/44* (2013.01); *H01L 31/035218* (2013.01);
(Continued)

(58) Field of Classification Search
None
See application file for complete search history.

(56) References Cited

U.S. PATENT DOCUMENTS

| 7,863,628 B2 * | 1/2011 | Choi ...................... B82Y 20/00 257/13 |
| 8,525,022 B2 * | 9/2013 | Ho ........................ H01L 51/426 136/255 |

(Continued)

OTHER PUBLICATIONS

Wang et al., "Chapter 1. Fabrication Techniques of Graphene Nanostructures", "Nanofabrication and its Application in Renewable Energy", Mar. 25, 2014, Royal Society of Chemistry, Cambridge, 30 pages, (Abstract).

(Continued)

*Primary Examiner* — Minh Loan Tran
(74) *Attorney, Agent, or Firm* — Dinsmore & Shohl LLP

(57) ABSTRACT

A method comprising: depositing a quantum dot solution onto an as-grown layer of channel material to form a layer of quantum dot material having a substantially uniform thickness across the area of the layer of quantum dot material; and transferring the layers of channel and quantum dot material as a single stack onto a substrate comprising source and drain electrodes such that both the layers of channel and quantum dot material substantially conform to the topography of the underlying substrate and electrodes whilst maintaining the substantially uniform thickness of quantum dot material, the source and drain electrodes configured to enable a flow of electrical current through the layer of channel material, the layer of quantum dot material configured to generate electron-hole pairs on exposure to incident electromagnetic radiation to produce a detectable change in the flow of electrical current which is indicative of one or more of the presence and magnitude of the incident electromagnetic radiation.

15 Claims, 5 Drawing Sheets

(51) Int. Cl.
*H01L 31/10* (2006.01)
*G01J 1/44* (2006.01)
*H01L 31/18* (2006.01)

(52) U.S. Cl.
CPC .......... *H01L 31/10* (2013.01); *H01L 31/1136* (2013.01); *H01L 31/18* (2013.01)

(56) References Cited

U.S. PATENT DOCUMENTS

| | | | |
|---|---|---|---|
| 9,030,189 B2* | 5/2015 | Sargent | .......... H01L 31/035218 136/255 |
| 9,627,562 B2* | 4/2017 | Zhang | .................... B82Y 40/00 |
| 9,735,236 B2* | 8/2017 | Jain | ...................... H01L 29/158 |
| 2011/0036971 A1 | 2/2011 | Ho et al. | |
| 2013/0049738 A1 | 2/2013 | Hartley | |

OTHER PUBLICATIONS

Zhan et al., "Graphene Field-Effect Transistor and Its Application for Electronic Sensing", Small, Jul. 7, 2014, vol. 10, Issue 2, (Abstract).

Extended European Search Report received for corresponding European Patent Application No. 16162244.4, dated Oct. 2, 2017, 15 pages.

International Search Report and Written Opinion received for corresponding Patent Cooperation Treaty Application No. PCT/FI2017/050182, dated Sep. 25, 2018, 9 pages.

International Preliminary Report on Patentability received for corresponding Patent Cooperaton Treaty Application No. PCT/FI2017/050182, dated May 29, 2017, 19 pages.

* cited by examiner

Known structure

Invented structure

QUANTUM DOT PHOTODETECTOR APPARATUS AND ASSOCIATED METHODS

TECHNICAL FIELD

The present disclosure relates particularly to photodetectors, associated methods and apparatus. Certain embodiments specifically concern a method of forming a photodetector apparatus comprising the deposition of a quantum dot solution onto an as-grown layer of channel material to form a layer of quantum dot material having a substantially uniform thickness, followed by the transfer of the layers of channel and quantum dot material as a single stack onto a substrate comprising source and drain electrodes such that both the layers of channel and quantum dot material substantially conform to the topography of the underlying substrate and electrodes whilst maintaining the substantially uniform thickness. Some embodiments may relate to a component or module suitable for one or more of the following devices/apparatus: solar cells, imaging sensors, display surfaces and portable electronic devices, in particular, so-called hand-portable electronic devices which may be hand-held in use (although they may be placed in a cradle in use). Such hand-portable electronic devices include so-called Personal Digital Assistants (PDAs) and tablet PCs.

The portable electronic devices/apparatus according to one or more disclosed example aspects/embodiments may provide one or more audio/text/video communication functions (e.g. tele-communication, video-communication, and/or text transmission, Short Message Service (SMS)/Multimedia Message Service (MMS)/emailing functions, interactive/non-interactive viewing functions (e.g. web-browsing, navigation, TV/program viewing functions), music recording/playing functions (e.g. MP3 or other format and/or (FM/AM) radio broadcast recording/playing), downloading/sending of data functions, image capture function (e.g. using a (e.g. in-built) digital camera), and gaming functions.

BACKGROUND

Research is currently being done to develop new photodetector devices.

The listing or discussion of a prior-published document or any background in this specification should not necessarily be taken as an acknowledgement that the document or background is part of the state of the art or is common general knowledge.

SUMMARY

According to a first aspect, there is provided a method comprising:
depositing a quantum dot solution onto an as-grown layer of channel material to form a layer of quantum dot material having a substantially uniform thickness across the area of the layer of quantum dot material; and
transferring the layers of channel and quantum dot material as a single stack onto a substrate comprising source and drain electrodes such that both the layers of channel and quantum dot material substantially conform to the topography of the underlying substrate and electrodes whilst maintaining the substantially uniform thickness of quantum dot material, the source and drain electrodes configured to enable a flow of electrical current through the layer of channel material, the layer of quantum dot material configured to generate electron-hole pairs on exposure to incident electromagnetic radiation to produce a detectable change in the flow of electrical current which is indicative of one or more of the presence and magnitude of the incident electromagnetic radiation.

The topography of the underlying substrate and electrodes may comprise structural features having one, two or three dimensions of less than 5 nm, 10 nm, 25 nm, 50 nm, 100 nm, 500 nm or 1 μm in size.

The layer of channel material may have a thickness of less than 1 nm, 2 nm, 3 nm, 4 nm, 5 nm, 10 nm or 25 nm.

The layer of channel material may have an elastic modulus of less than 10 $TN/m^2$ (for example, graphene has Young's modulus estimated to be ~1 TPa).

The layer of channel material may comprise a conductive or semi-conductive two-dimensional material.

The conductive or semi-conductive two-dimensional material may comprise one or more of graphene, reduced graphene oxide, a graphene-like material, and a transition metal dichalcogenide.

The graphene-like material may comprise one or more of phosphorene, silicene, germanene, stanene, GaN, InN, InP, InAs, BAs and GaP.

The transition metal dichalcogenide may comprise one or more of $WX_2$, $MoX_2$, $ScX_2$, $TiX_2$, $HfX_2$, $ZrX_2$, $VX_2$, $CrX_2$, $MnX_2$, $FeX_2$, $CoX_2$, $NiX_2$, $NbX_2$, $TcX_2$, $ReX_2$, $PdX_2$ and $PtX_2$, where X=S, Se or Te.

The layer of quantum dot material may have a thickness of less than 10 nm, 25 nm, 50 nm or 100 nm.

The layer of quantum dot material may have an elastic modulus of less than 100 $GN/m^2$ (for example, 8-12 GPa has been reported for thick, essentially 3D, trioctylphosphine-oxide-coated CdSe nanoparticle films).

The layer of quantum dot material may comprise a plurality of quantum dots.

The plurality of quantum dots may comprise one or more of PbS, CdSe, CdS, PbSe, ZnO, ZnS, CZTS, $Cu_2S$, $Bi_2S_3$, $Ag_2S$, $Ag_2S$, HgTe, CdHgTe, InAs, InSb, Ge and CIS.

One or more of the material, size and shape of the quantum dots may be configured such that the electron-hole pairs are generated on exposure to at least one of the following types of electromagnetic radiation: x-rays, visible light, infrared, ultraviolet, radio waves, microwaves, gamma rays and thermal radiation.

The method may comprise growing the layer of channel material before deposition of the quantum dot solution.

Growing the layer of channel material may comprise growing the layer of channel material on a layer of catalyst material via chemical vapour deposition using the layer of catalyst material as a seed layer.

The layer of catalyst material may comprise one or more of a metal foil and a metal thin film.

One or more of the metal foil and metal thin film may comprise at least one of copper, nickel and platinum.

Growing the layer of channel material on the layer of catalyst material may comprise:
growing a layer of channel material on each surface of the layer of catalyst material; and
removing the layer of channel material formed on the surface of the layer of catalyst material opposite the layer of quantum dot material.

Removing the layer of channel material may comprise etching or delaminating the layer of channel material from the surface of the layer of catalyst material.

Transferring the layers of channel and quantum dot material may comprise wet transfer of the single stack from solution onto the substrate.

The method may comprise depositing a layer of carrier material onto the layer of quantum dot material to facilitate transfer of the layers of channel and quantum dot material.

The layer of carrier material may be a layer of passivating carrier material configured to protect the underlying layers of material from the surrounding environment.

The layer of carrier material may comprise one or more of poly(methyl methacrylate), polycarbonate and parylene.

Depositing the quantum dot solution may comprise spin-coating or inkjet printing the quantum dot solution onto the layer of channel material.

The quantum dot solution may comprise a plurality of quantum dots having primary ligands attached thereto to stabilise the quantum dots in solution, and the method may comprise depositing a ligand-exchange solution onto the quantum dot material to cause replacement of the primary ligands with shorter-chain secondary ligands, replacement of the primary ligands with the secondary ligands allowing the plurality of quantum dots to become sufficiently close-packed to facilitate charge transfer therebetween.

The quantum dot solution may comprise one or more of an organic aromatic solvent, an organic nonpolar solvent and an aqueous solvent.

The organic aromatic solvent may comprise one or more of toluene, chlorobenzene, xylene and NMP.

The organic nonpolar solvent may comprise one or more of hexane, octane and other alkanes.

The ligand-exchange solution may comprise acetonitrile.

The primary ligands may comprise one or more of thio-, amino-, carboxylic-, phosphonato-, sulfonate or alkyl or aromatic tail groups such as: oleic acid, oleate, trioctylphosphine oxide, alkylphosphonic acid, fatty acid and long-chain alkylamine.

The secondary ligands may comprise one or more of 1,2-ethanedithiol, methylamine, ethylamine, ethylene diamine, ethanethiol, propanethiol, 1,3-benzenedithiol, hydrazine, formic acid, oxalic acid, acetic acid, pyridine, butylamine, formamide, $SnS_4$, $PbBr_2$, $PbI_2$ and $PbCl_2$, $Na_2S.9H_2O$, KOH.

The method may comprise depositing a rinse solution onto the layer of quantum dot material to remove the primary ligands and any excess secondary ligands.

The rinse solution may comprise one or more of acetonitrile and toluene.

The method may comprise drying one or more of the quantum dot solution, the ligand-exchange solution and the rinse solution after deposition to remove any solvent from the respective solutions.

The method may comprise removing the layer of catalyst material before transferring the layers of channel and quantum dot material.

Removing the layer of catalyst material may comprise etching or delaminating the layer of catalyst material from the layer of channel material.

The method may comprise forming the source and drain electrodes on the substrate before transfer of the layers of channel and quantum dot material.

The source and drain electrodes may define a plurality of pixels, the layer of channel material may be a continuous layer common to the plurality of pixels, and the source and drain electrodes may be configured to inhibit a flow of electrical current between the plurality of pixels.

The plurality of pixels may have an enclosed-cell or interdigitated geometry.

The source and drain electrodes may define a plurality of pixels, the layer of channel material may be a continuous layer common to the plurality of pixels, and the method may comprise patterning the continuous layer of channel material to inhibit a flow of electrical current between the plurality of pixels.

The method may comprise forming a gate electrode configured to enable the electrical conductivity of the layer of channel material to be tuned by a voltage applied to the gate electrode.

The gate electrode may comprise one or more of a bottom gate electrode positioned below the layer of channel material and a top gate electrode positioned above the layer of channel material.

The source, drain and gate electrodes may comprise one or more of a metal, a metal nanoparticle ink, silver, gold, copper, nickel, cobalt, palladium, a conductive metal oxide, a carbon-based material, an organic material and a polymer.

According to a further aspect, there is provided an apparatus formed by any method described herein.

According to a further aspect, there is provided an apparatus comprising a layer of channel material, source and drain electrodes positioned below the layer of channel material configured to enable a flow of electrical current through the layer of channel material, a layer of quantum dot material positioned on top of the layer of channel material configured to generate electron-hole pairs on exposure to incident electromagnetic radiation to produce a detectable change in the flow of electrical current which is indicative of one or more of the presence and magnitude of the incident electromagnetic radiation, and a substrate configured to support the source and drain electrodes and the layers of channel and quantum dot material,
  wherein both the layers of channel and quantum dot material substantially conform to the topography of the underlying substrate and electrodes, and
  wherein the layer of quantum dot material has a substantially uniform thickness across the area of the layer of quantum dot material.

The apparatus may be one or more of an electronic device, a portable electronic device, a portable telecommunications device, a mobile phone, a personal digital assistant, a tablet, a phablet, a desktop computer, a laptop computer, a server, a smartphone, a smartwatch, smart eyewear, a photodetector, and a module for one or more of the same.

According to a further aspect, there is provided a method of using an apparatus,
  the apparatus comprising a layer of channel material, source and drain electrodes positioned below the layer of channel material configured to enable a flow of electrical current through the layer of channel material, a layer of quantum dot material positioned on top of the layer of channel material configured to generate electron-hole pairs on exposure to incident electromagnetic radiation to produce a detectable change in the flow of electrical current which is indicative of one or more of the presence and magnitude of the incident electromagnetic radiation, and a substrate configured to support the source and drain electrodes and the layers of channel and quantum dot material, wherein both the layers of channel and quantum dot material substantially conform to the topography of the underlying substrate and electrodes, and wherein the layer of quantum dot material has a substantially uniform thickness across the area of the layer of quantum dot material, the method comprising determining one or more of the presence and magnitude of the incident electromagnetic radiation based on a detectable change in the flow of electrical current through the layer of channel material.

The steps of any method disclosed herein do not have to be performed in the exact order disclosed, unless explicitly stated or understood by the skilled person.

Corresponding computer programs for implementing one or more steps of the methods disclosed herein are also within the present disclosure and are encompassed by one or more of the described example embodiments.

One or more of the computer programs may, when run on a computer, cause the computer to configure any apparatus, including a battery, circuit, controller, or device disclosed herein or perform any method disclosed herein. One or more of the computer programs may be software implementations, and the computer may be considered as any appropriate hardware, including a digital signal processor, a microcontroller, and an implementation in read only memory (ROM), erasable programmable read only memory (EPROM) or electronically erasable programmable read only memory (EEPROM), as non-limiting examples. The software may be an assembly program.

One or more of the computer programs may be provided on a computer readable medium, which may be a physical computer readable medium such as a disc or a memory device, or may be embodied as a transient signal. Such a transient signal may be a network download, including an internet download.

The present disclosure includes one or more corresponding aspects, example embodiments or features in isolation or in various combinations whether or not specifically stated (including claimed) in that combination or in isolation. Corresponding means for performing one or more of the discussed functions are also within the present disclosure.

The above summary is intended to be merely exemplary and non-limiting.

BRIEF DESCRIPTION OF THE FIGURES

A description is now given, by way of example only, with reference to the accompanying drawings, in which:—

DESCRIPTION OF SPECIFIC ASPECTS/EMBODIMENTS

Figure 1:
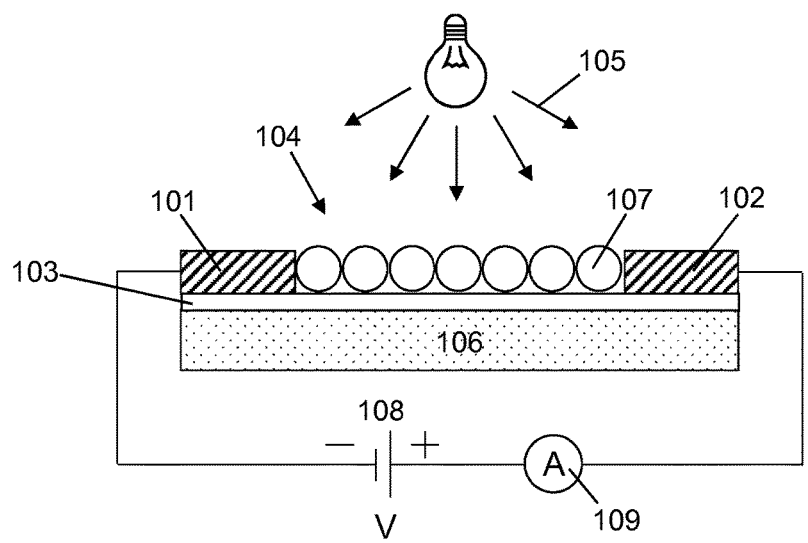
FIG. 1 shows a photodetector apparatus comprising a quantum dot field-effect transistor.

FIG. 1 shows a photodetector apparatus 100 comprising a quantum dot field-effect transistor. Field-effect transistors normally comprise source 101 and drain 102 electrodes configured to enable a flow of electrical current through a layer of channel material 103 between the source 101 and drain 102 electrodes, and a gate electrode configured to vary the electrical current flowing through the channel member 103 when a voltage is applied thereto. To enable photodetection, however, the gate electrode is replaced (or supplemented, which can be more likely in some implementations so that the gate electrode is on the substrate side and the quantum dots are acting as a top gate) by a layer of quantum dot material 104 configured to produce a detectable change in the electrical current on exposure to incident electromagnetic radiation 105 which is indicative of one or more of the presence and magnitude of the incident electromagnetic radiation 105.

The layer of quantum dot material 104 is formed on top of the layer of channel material 103 (which itself is supported on a substrate 106) and comprises a plurality of quantum dots 107 configured to generate electron-hole pairs on exposure to the incident electromagnetic radiation 105. The photodetector apparatus 100 is configured such that, after the generation of these electron-hole pairs, either the electrons or the holes are transferred to the channel member 103 leaving the remaining charge carriers on the quantum dots 107. These remaining charge carriers then gate the channel member 103 causing a detectable change in the current flowing therethrough.

The photodetector apparatus 100 also comprises a power supply 108 configured to apply a potential difference V between the source 101 and drain 102 electrodes, and an ammeter 109 configured to measure the electrical current flowing through the layer of channel material 103.

Rather than forming the electrodes 101, 202 on top of the layer of channel material 103 as shown in FIG. 1, the electrodes (together with their respective electrical connections) are sometimes pre-formed on a target substrate and the layer of channel material 103 is transferred from a growth substrate onto the pre-formed electrodes. This approach allows generic electrode modules to be manufactured for use in various different field-effect devices, and also limits the number of lithographic processing steps performed on the sensitive channel material. The layer of channel material 103 is usually transferred using a layer of carrier material, which is deposited on top of the layer of channel material 103 and subsequently removed. Once the layer of carrier material has been removed, a quantum dot solution comprising a plurality of quantum dots 107 within a solvent (usually having ligands attached thereto to stabilise the quantum dots 107 in solution) is then deposited on top of the layer of channel material 103 and dried to form the layer of quantum dot material 104. A layer of passivation material can then be deposited on top of the layer of quantum dot material 104 to protect the underlying layers of material from the surrounding environment.

Figure 2:
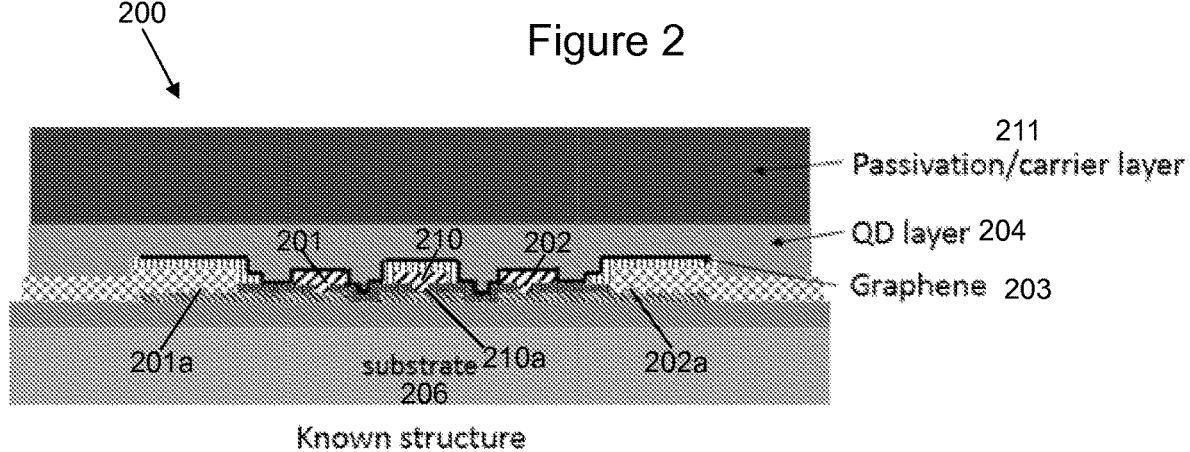
FIG. 2 shows a photodetector apparatus formed using a prior art technique.

FIG. 2 shows one example of a photodetector apparatus 200 formed using the above method. The photodetector apparatus 200 comprises source 201, drain 202 and gate 210 electrodes, respective connections 201a, 202a, 210a to/from the source 201, drain 202 and gate 210 electrodes, a layer of channel material 203, a layer of quantum dot material 204 and a layer of passivation material 211, all supported on a target substrate 206. As can be seen from this figure, one issue with the above-mentioned method is that the resulting layer of quantum-dot material 204 has a non-uniform thickness. This is because the quantum dot solution has a planar surface and conforms to the topography of the underlying layers of material (given that it is deposited in liquid form).

Figure 3:
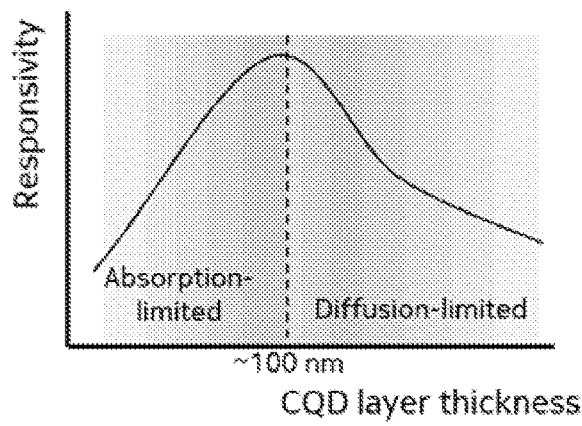
FIG. 3 shows how the responsivity of a photodetector apparatus varies with the thickness of the quantum dot layer.

FIG. 3 shows how the responsivity of a quantum dot photodetector apparatus varies with the thickness of the layer of (colloidal) quantum dots, CQDs. As the thickness decreases, the layer of quantum dots becomes less efficient at absorbing the incident electromagnetic radiation (i.e. it is absorption limited). As the thickness increases, on the other hand, the distance that the generated charge carriers have to travel to reach the layer of channel material also increases resulting in a greater probability of charge recombination (i.e. it is diffusion limited). The optimum thickness depends on the dynamics of the charge carriers (which is itself dependent upon the quantum dot material), the surface states of the quantum dots, and the ligands attached thereto. In the case of PbS quantum dots with ethanedithiol ligands (for example), the optimal thickness of the layer of quantum dot material is around 100 nm, as indicated in FIG. 3 (the topography of the substrate when electrodes are deposited prior to channel material transfer are of the order of 100 nm, and therefore there is significant thickness variation by using a liquid-phase QD deposition).

Given that the responsivity of a quantum dot photodetector apparatus 200 is dependent upon the thickness of the layer of quantum dot material 204, the non-uniform thickness produced by the existing fabrication process results in a photodetector apparatus 200 with a suboptimal responsivity to the incident electromagnetic radiation. Another issue with the existing fabrication process is that the deposition of the layer of carrier material directly on top of the layer of channel material 203 tends to leave residual carrier material (typically a polymer) on the surface of the channel material 203 after the layer of carrier material has been removed. This can impede charge transfer from the layer of quantum dot material 204 to the layer of channel material 203 and therefore inhibit photodetection.

Figure 4:
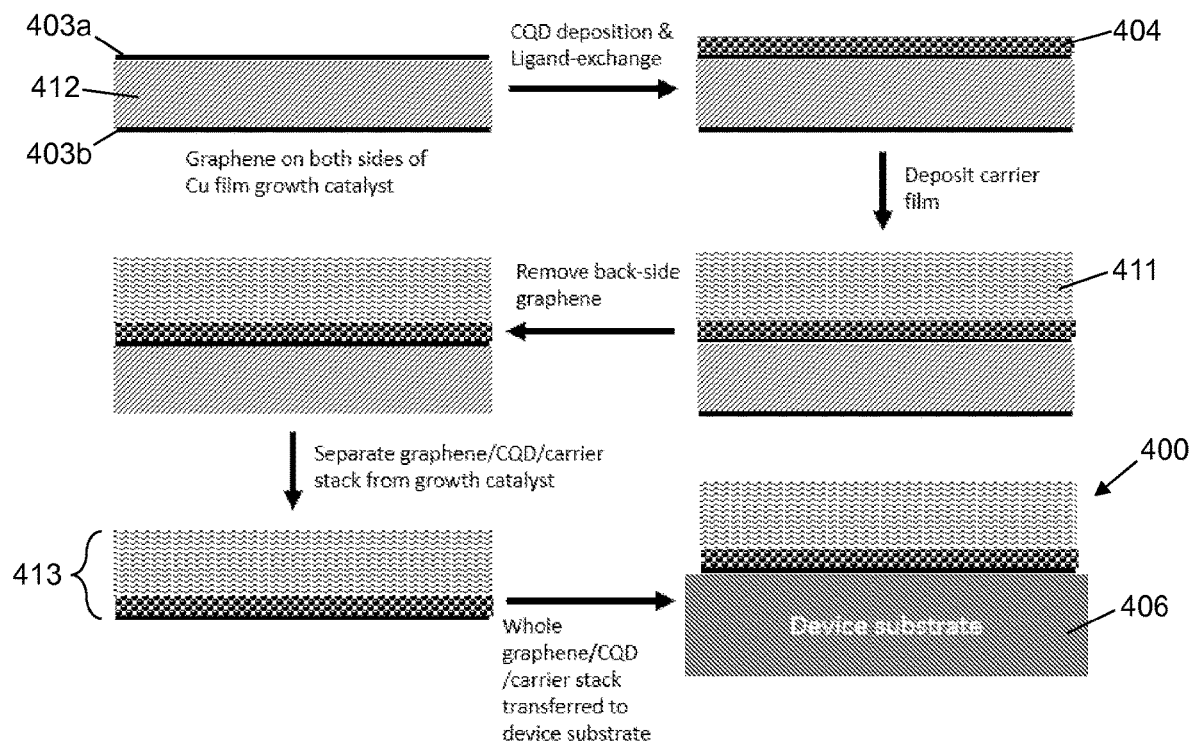
FIG. 4 shows one example of a method of forming a photodetector apparatus.

FIG. 4 shows one example of an alternative fabrication process for forming a photodetector apparatus 400 that may address one or more of the above-mentioned issues. As per the existing process, a layer of channel material 403a,b is first formed on a growth substrate 412. In the illustrated example, the layer of channel material 403a,b comprises graphene which is grown on both sides of a layer of copper via chemical vapour deposition using the layer of copper as a catalyst/seed layer. Other materials and growth techniques may be used instead. Unlike the existing process, however, a quantum dot solution is then deposited (e.g. by spin-coating or inkjet printing) onto the upper as-grown layer of channel material 403a to form a layer of quantum dot material 404 having a substantially uniform thickness across the area of the layer of quantum dot material 404.

The quantum dot solution comprises a plurality of quantum dots having primary ligands attached thereto to stabilise the quantum dots in solution. The primary ligands are generally long-chain (~2 nm) fatty acids which can hinder the formation of a close-packed quantum dot layer 404 and should ideally be replaced with shorter-chain secondary ligands having a chain length which is sufficiently short to enable charge transfer between the quantum dots. To achieve this, a ligand-exchange solution is deposited onto the quantum dot material 404 followed by a rinse solution to remove the primary ligands and any excess secondary ligands. One or more of the quantum dot, ligand-exchange and rinse solutions may be dried after deposition to remove any residual solvent.

Once the layer of quantum dot material 404 has been formed, a layer of carrier material 411 is deposited onto the layer of quantum dot material 404 to facilitate transfer of the layers of channel 403a and quantum dot material 404, and the lower as-grown layer of channel material 403b and the layer of catalyst material 412 are removed (e.g. by etching or delamination). The layers of channel 403a, quantum dot 404 and carrier 411 material are then transferred as a single stack 413 onto a target substrate 406 comprising source and drain (and possibly gate) electrodes. The transfer step may be performed by wet transfer of the single stack 413 from solution onto the target substrate 406 using capillary forces. Alternatively, the layer of carrier material 411 may enable the single stack 413 to be transferred mechanically by hand or machine e.g. by lamination without damaging the layers of channel 403a or quantum dot 404 material.

Figure 5:
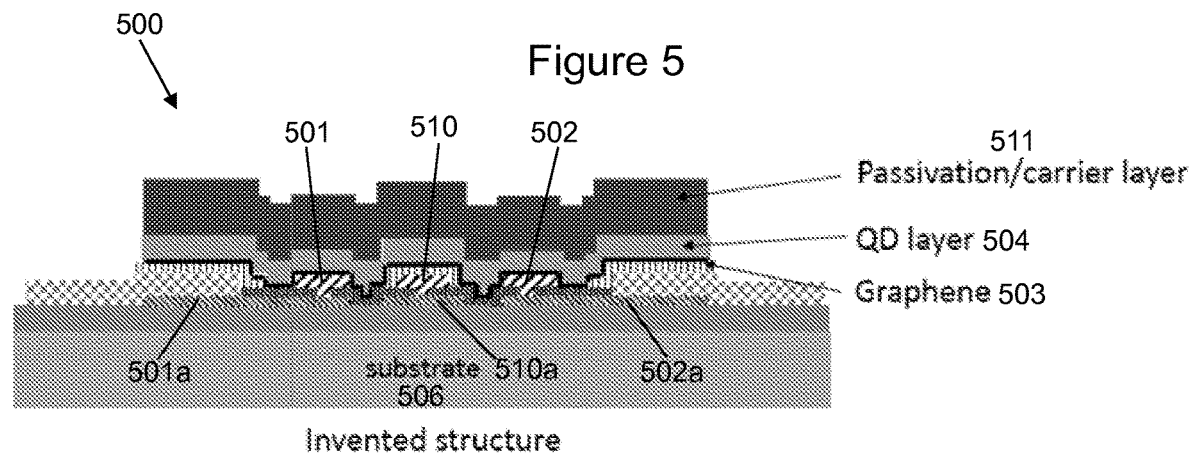
FIG. 5 shows a photodetector apparatus formed using the method of FIG. 4.

FIG. 5 shows one example of a photodetector apparatus 500 formed using the method of FIG. 4. As can be seen, the layer of quantum dot material 504 has a substantially uniform thickness which increases the responsivity of the photodetector apparatus 500. The substantially uniform thickness occurs because the quantum dot solution is deposited onto the as-grown layer of channel material 503 to form a layer of quantum dot material 504 before the layer of channel material 503 is transferred to the target substrate 506. Furthermore, because the quantum dot solution is deposited on top of the as-grown layer of channel material 503, the interface between the layers of channel 503 and quantum dot 504 material is free from other materials (in particular, residual carrier material 511). This aspect facilitates charge transfer from the layer of quantum dot material 504 to the layer of channel material 503 during photodetection.

It should be noted, however, that whilst the process shown in FIG. 4 comprises a number of different steps, the key steps of the method are the deposition of a quantum dot solution onto an as-grown layer of channel material 403a to form a layer of quantum dot material 404 having a substantially uniform thickness across the area of the layer of quantum dot material 404; and the subsequent transfer of the layers of channel 403a and quantum dot 404 material as a single stack 413 onto a substrate 406 comprising source and drain electrodes such that both the layers of channel 403a and quantum dot 404 material substantially conform to the topography of the underlying substrate 406 and electrodes whilst maintaining the substantially uniform thickness. These steps provide the above-mentioned technical advantages over the existing fabrication process. The other steps shown in FIG. 4 are not essential features of the present method and are therefore optional.

As shown in FIG. 5 and mentioned above, the layers of channel 503 and quantum dot 504 material (and in some cases, the layer of carrier material 511) substantially conform to the topography of the underlying substrate 506 and electrodes 501, 502, 510. The conformity of the layers 503, 504, 511 may depend on one or more of the thickness of the respective layers 503, 504, 511, the elastic modulus of the respective layers 503, 504, 511, the structure of the respective layers 503, 504, 511 and the dimensions of the topographic features 501, 502, 510. In this respect, the layer of channel material 503 may have a thickness of less than 1 nm, 2 nm, 3 nm, 4 nm, 5 nm, 10 nm or 25 nm, and an elastic modulus of less than 10 $TN/m^2$; the layer of quantum dot material 504 may have a thickness of less than 10 nm, 25 nm, 50 nm or 100 nm, and an elastic modulus of less than 100 $GN/m^2$; the layer of channel material 503 may comprise a conductive or semi-conductive two-dimensional material, and the layer of quantum dot material 504 may comprise a plurality of quantum dots (i.e. a particulate form); and the topography of the underlying substrate 506 and electrodes 501, 502, 510 may comprise structural features having one, two or three dimensions of less than 5 nm, 10 nm, 25 nm, 50 nm, 100 nm, 500 nm or 1 μm in size.

The layer of carrier material 511 may comprise a resilient polymer having a thickness of 100 nm-1 μm and an elastic modulus of less than 10 GN/m$^2$ (for example PMMA is ~3 GPa). In some examples, the layer of carrier material 511 may be a layer of passivating carrier material configured to protect the underlying layers of material 503, 504 from the surrounding environment. In this scenario, the same layer of carrier material 511 facilitates transfer of the single stack to the target substrate 506 and also passivates the resulting apparatus 500. This simplifies the fabrication process by avoiding the need to remove the layer of carrier material 511 and deposit a separate layer of passivation material.

Most photodetectors 500 comprise a large number of light-sensitive pixels in order to detect the presence and/or magnitude of incident electromagnetic radiation at different spatial regions of the photodetector 500 (e.g. to form a digital image). The fabrication process described above is particularly advantageous in multi-pixel photodetectors because the substantially uniform thickness of the layer of quantum dot material 504 helps to ensure that there is little variation in responsivity from one pixel to another.

It is also important that the pixels are electrically isolated from one another in order to avoid crosstalk. This is typically achieved by patterning the layer of channel material 503 after it has been transferred to the target substrate 506 to divide it into a plurality of discrete conductive channels. As mentioned above, however, the layer of channel material 503 is often sensitive to the chemicals and processes used in lithographic processing and can therefore be vulnerable to damage during the patterning step(s). To address this issue, the source 501 and drain 502 (and possibly gate 510) electrodes may be configured to define the respective pixels and inhibit a flow of electrical current therebetween. This allows a continuous layer of channel 503 to be used which is common to some or all of the pixels.

Figure 6:
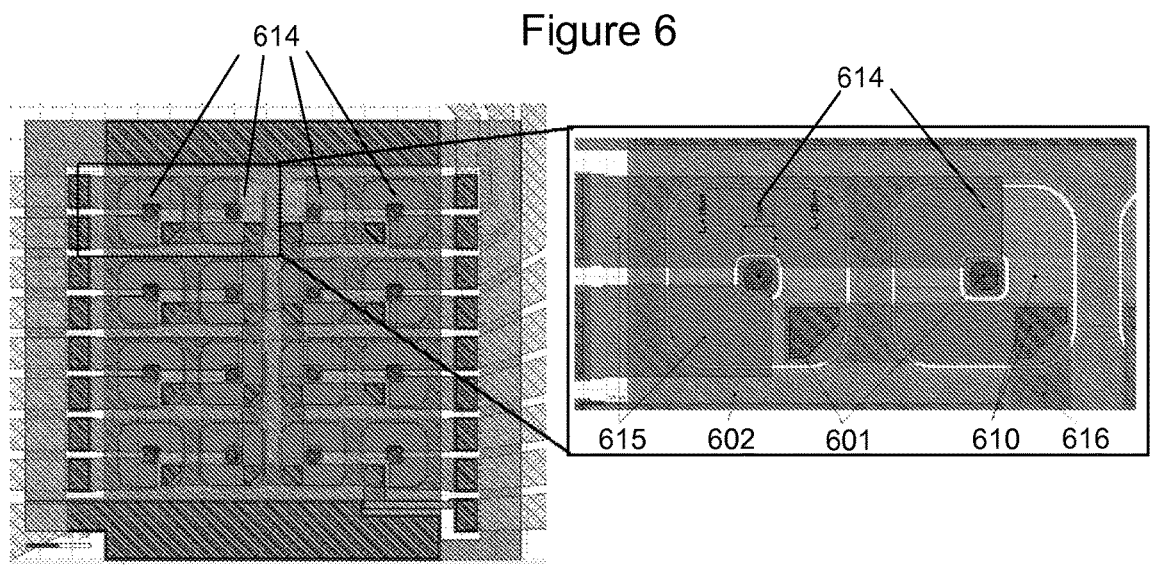
FIG. 6 shows a plurality of photodetector pixels in plan view having an enclosed-cell electrode geometry.

FIG. 6 shows a plurality of photodetector pixels 614 in plan view having an enclosed-cell electrode geometry, and an enlarged view showing greater detail of two adjacent pixels 614. Each pixel 614 comprises a source electrode 601 configured to provide a source of charge carriers, a drain electrode 602 configured to provide a current sink for the charge carriers, and a gate electrode 610 configured to tune the conductivity of the region of channel material between the source electrode 601 and the drain electrode 602. The enlarged view also shows source routing 615 and gate routing 616 to/from the respective source 601 and gate 610 electrodes.

The drain electrode 602 of each pixel 614 forms a substantially continuous in-plane perimeter which substantially encloses both the source electrode 601 and the gate electrode 610 when viewed from above the electrode plane. This structure serves to inhibit the flow of charge carriers from the source electrode 601 of a pixel 614 beyond the drain electrode 602 of that pixel 614. Thus charge carriers introduced via the source electrode 601 flow generally radially to the drain electrode 602 defining the outer perimeter of the pixel 614. Furthermore, in this example, the same drain electrode 602 surrounds the source 601 and gate 610 electrodes of each of the different pixels 614 and is therefore common to all pixels 614 of the photodetector (although in other examples, it may only be common to a subset of these pixels 614). This configuration simplifies fabrication of the apparatus because it allows a continuous layer of conductive material to be used for the drain electrode 602.

It will be appreciated by those skilled in the art that the source 601 and drain 602 electrodes in FIG. 6 could be reversed such that the source electrode 601 defines the perimeter of each pixel 614 rather than the drain electrode 602. Another electrode configuration which could be used to inhibit crosstalk between adjacent pixels 614 is an interdigitated electrode geometry (not shown). With this geometry, the source electrode may comprise a linear portion, and the drain electrode may comprise two parallel connected linear portions positioned on either side of the linear portion of the source electrode. As with the enclosed-cell electrode geometry, the drain electrode may be common to all pixels. In this scenario, the drain electrode may comprise three or more parallel connected linear portions configured to complement the respective linear portions of the source electrodes. As also mentioned in relation to the enclosed-cell electrode geometry, the source and drain electrodes could be reversed and still inhibit crosstalk.

Figure 7:
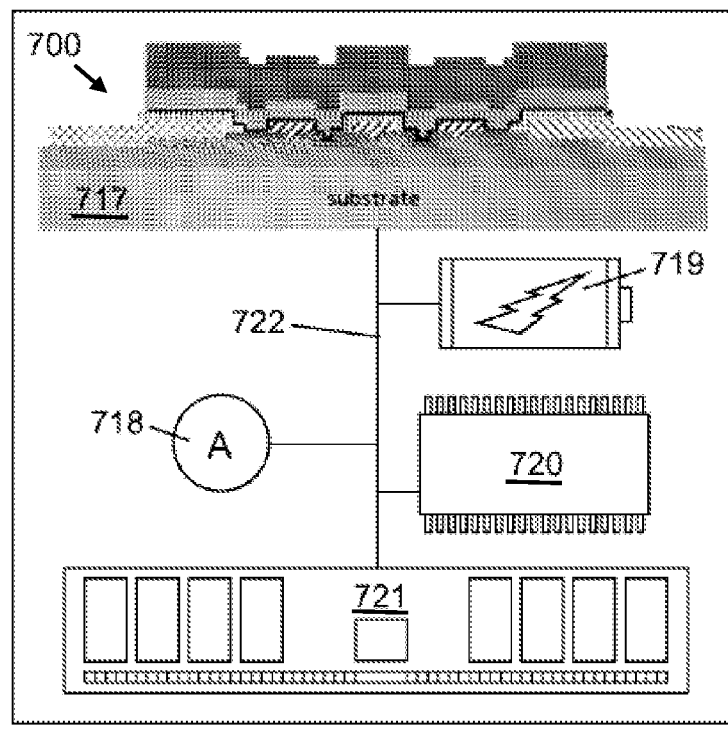
FIG. 7 shows another example of a photodetector apparatus.

FIG. 7 shows another example of a photodetector apparatus 700. The apparatus 700 may be one or more of an electronic device, a portable electronic device, a portable telecommunications device, a mobile phone, a personal digital assistant, a tablet, a phablet, a desktop computer, a laptop computer, a server, a smartphone, a smartwatch, smart eyewear, a photodetector, a solar cell, an imaging sensor, a display surface, and a module for one or more of the same. In the example shown, the apparatus 700 comprises the quantum dot field-effect transistor 717 described previously, an ammeter 718, a power supply 719, a processor 720 and a storage medium 721, which are electrically connected to one another by a data bus 722.

The processor 720 is configured for general operation of the apparatus 700 by providing signalling to, and receiving signalling from, the other components to manage their operation. The storage medium 721 is configured to store computer code configured to perform, control or enable operation of the apparatus 700. The storage medium 721 may also be configured to store settings for the other components. The processor 720 may access the storage medium 721 to retrieve the component settings in order to manage the operation of the other components.

Under the control of the processor 720, the power supply 719 is configured to apply a voltage between the source and drain electrodes of the quantum dot field-effect transistor 717 to enable a flow of electrical current through the layer of channel material. In addition, the power supply 719 may be configured to apply a further voltage to the gate electrode to tune the conductivity of the layer of channel material.

The ammeter 718 is configured to measure the electrical current through the layer of channel material so that any change in current caused by the incident electromagnetic radiation can be determined. Based on the change in electrical current, the processor 720 is configured to determine one or more of the presence and magnitude of the incident electromagnetic radiation. In order to determine the presence/magnitude of the incident electromagnetic radiation, the processor 720 may use predetermined calibration data saved in the storage medium 721 which correlates the intensity of the electromagnetic radiation with the change in current.

The processor 720 may be a microprocessor, including an Application Specific Integrated Circuit (ASIC). The storage medium 721 may be a temporary storage medium such as a volatile random access memory. On the other hand, the storage medium 721 may be a permanent storage medium such as a hard disk drive, a flash memory, or a non-volatile random access memory. The power supply 719 may comprise one or more of a primary battery, a secondary battery, a capacitor, a supercapacitor and a battery-capacitor hybrid.

Figure 8:
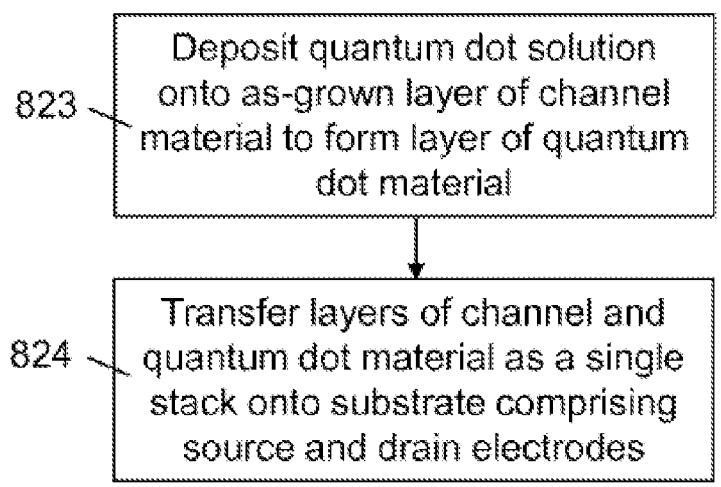
FIG. 8 shows a method of making a photodetector apparatus.

FIG. 8 shows schematically the main steps 823-824 of a method of making a photodetector apparatus. The method generally comprises: depositing a quantum dot solution onto an as-grown layer of channel material to form a layer of quantum dot material having a substantially uniform thickness across the area of the layer of quantum dot material 823; and transferring the layers of channel and quantum dot material as a single stack onto a substrate comprising source and drain electrodes such that both the layers of channel and quantum dot material substantially conform to the topography of the underlying substrate and electrodes whilst maintaining the substantially uniform thickness 824.

Figure 9:
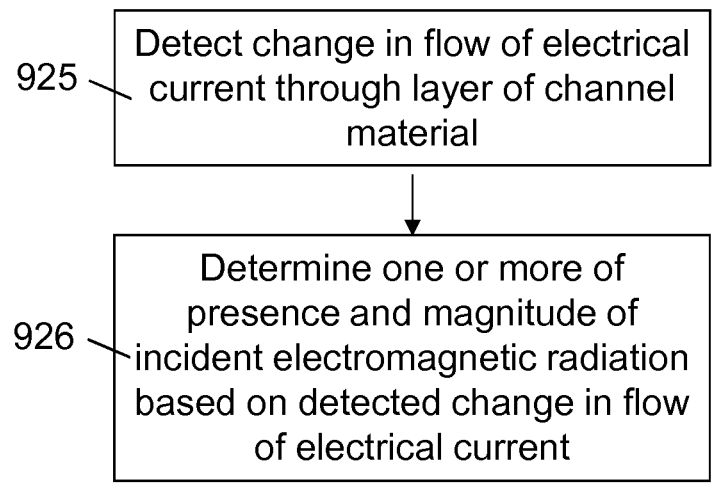
FIG. 9 shows a method of using a photodetector apparatus.

FIG. 9 shows schematically the main steps 925-926 of a method of using a photodetector apparatus. The method generally comprises: detecting a change in the flow of electrical current through the layer of channel material 925; and determining one or more of the presence and magnitude of the incident electromagnetic radiation based on the detected change in the flow of electrical current 926.

Figure 10:
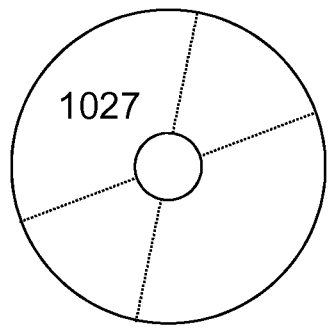
FIG. 10 shows a computer-readable medium comprising a computer program configured to perform, control or enable a method described herein.

FIG. 10 illustrates schematically a computer/processor readable medium 1027 providing a computer program according to one embodiment. The computer program may comprise computer code configured to perform, control or enable one or more of the method steps 823-926 of FIG. 8 or 9. In this example, the computer/processor readable medium 1027 is a disc such as a digital versatile disc (DVD) or a compact disc (CD). In other embodiments, the computer/processor readable medium 1027 may be any medium that has been programmed in such a way as to carry out an inventive function. The computer/processor readable medium 1027 may be a removable memory device such as a memory stick or memory card (SD, mini SD, micro SD or nano SD).

Other embodiments depicted in the figures have been provided with reference numerals that correspond to similar features of earlier described embodiments. For example, feature number 1 can also correspond to numbers 101, 201, 301 etc. These numbered features may appear in the figures but may not have been directly referred to within the description of these particular embodiments. These have still been provided in the figures to aid understanding of the further embodiments, particularly in relation to the features of similar earlier described embodiments.

It will be appreciated to the skilled reader that any mentioned apparatus/device and/or other features of particular mentioned apparatus/device may be provided by apparatus arranged such that they become configured to carry out the desired operations only when enabled, e.g. switched on, or the like. In such cases, they may not necessarily have the appropriate software loaded into the active memory in the non-enabled (e.g. switched off state) and only load the appropriate software in the enabled (e.g. on state). The apparatus may comprise hardware circuitry and/or firmware. The apparatus may comprise software loaded onto memory. Such software/computer programs may be recorded on the same memory/processor/functional units and/or on one or more memories/processors/functional units.

In some embodiments, a particular mentioned apparatus/device may be pre-programmed with the appropriate software to carry out desired operations, and wherein the appropriate software can be enabled for use by a user downloading a "key", for example, to unlock/enable the software and its associated functionality. Advantages associated with such embodiments can include a reduced requirement to download data when further functionality is required for a device, and this can be useful in examples where a device is perceived to have sufficient capacity to store such pre-programmed software for functionality that may not be enabled by a user.

It will be appreciated that any mentioned apparatus/circuitry/elements/processor may have other functions in addition to the mentioned functions, and that these functions may be performed by the same apparatus/circuitry/elements/processor. One or more disclosed aspects may encompass the electronic distribution of associated computer programs and computer programs (which may be source/transport encoded) recorded on an appropriate carrier (e.g. memory, signal).

It will be appreciated that any "computer" described herein can comprise a collection of one or more individual processors/processing elements that may or may not be located on the same circuit board, or the same region/position of a circuit board or even the same device. In some embodiments one or more of any mentioned processors may be distributed over a plurality of devices. The same or different processor/processing elements may perform one or more functions described herein.

It will be appreciated that the term "signalling" may refer to one or more signals transmitted as a series of transmitted and/or received signals. The series of signals may comprise one, two, three, four or even more individual signal components or distinct signals to make up said signalling. Some or all of these individual signals may be transmitted/received simultaneously, in sequence, and/or such that they temporally overlap one another.

With reference to any discussion of any mentioned computer and/or processor and memory (e.g. including ROM, CD-ROM etc), these may comprise a computer processor, Application Specific Integrated Circuit (ASIC), field-programmable gate array (FPGA), and/or other hardware components that have been programmed in such a way to carry out the inventive function.

The applicant hereby discloses in isolation each individual feature described herein and any combination of two or more such features, to the extent that such features or combinations are capable of being carried out based on the present specification as a whole, in the light of the common general knowledge of a person skilled in the art, irrespective of whether such features or combinations of features solve any problems disclosed herein, and without limitation to the scope of the claims. The applicant indicates that the disclosed aspects/embodiments may consist of any such individual feature or combination of features. In view of the foregoing description it will be evident to a person skilled in the art that various modifications may be made within the scope of the disclosure.

While there have been shown and described and pointed out fundamental novel features as applied to different embodiments thereof, it will be understood that various omissions and substitutions and changes in the form and details of the devices and methods described may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment may be incorporated in any other disclosed or described or suggested form or embodiment as a general matter of design choice. Furthermore, in the claims means-plus-function clauses are intended to cover the structures described herein as performing the recited function and not only structural equivalents, but also equivalent structures. Thus although a nail and a screw may not be structural equivalents in that a nail employs a cylindrical surface to secure wooden parts together, whereas a screw employs a helical surface, in the environment of fastening wooden parts, a nail and a screw may be equivalent structures.

The invention claimed is:

1. A method comprising:
depositing a quantum dot solution onto an as-grown layer of channel material to form a layer of quantum dot material having a substantially uniform thickness across the area of the layer of quantum dot material; and
transferring the layers of channel and quantum dot material as a single stack onto a substrate comprising source and drain electrodes such that both the layers of channel and quantum dot material substantially conform to the topography of the underlying substrate and electrodes whilst maintaining the substantially uniform thickness of quantum dot material, the source and drain electrodes configured to enable a flow of electrical current through the layer of channel material, the layer of quantum dot material configured to generate electron-hole pairs on exposure to incident electromagnetic radiation to produce a detectable change in the flow of electrical current which is indicative of one or 15 more of the presence and magnitude of the incident electromagnetic radiation.

2. The method of claim 1, wherein the topography of the underlying substrate and electrodes comprises structural features having one, two or three dimensions of less than 5 nm, 10 nm, 25 nm, 50 nm, 100 nm, 500 nm or 11 nm in size.

3. The method of claim 1 or 2, wherein the layer of channel material has a thickness of less than 1 nm, 2 nm, 3 nm, 4 nm, 5 nm, 10 nm or 25 nm, and an elastic modulus of less than 10 TN/m².

4. The method of claim 1, wherein the layer of quantum dot material has a thickness of less than 10 nm, 25 nm, 50 nm or 100 μm, and an elastic modulus of less than 100 GN/m².

5. The method of claim 1, wherein the layer of channel material comprises a conductive or semi-conductive two-dimensional material, and the layer of quantum dot material comprises a plurality of quantum dots.

6. The method of claim 1, wherein transferring the layers of channel and quantum dot material comprises wet transfer of the single stack from solution onto the substrate.

7. The method of claim 1, wherein the method comprises depositing a layer of carrier material onto the layer of quantum dot material to facilitate transfer of the layers of channel and quantum dot material.

8. The method of claim 7, wherein the layer of carrier material is a layer of passivating carrier material configured to protect the underlying layers of material from the surrounding environment.

9. The method of claim 1, wherein the quantum dot solution comprises a plurality of quantum dots having primary ligands attached thereto to stabilise the quantum dots in solution, and wherein the method comprises depositing a ligand-exchange solution onto the quantum dot material to cause replacement of the primary ligands with shorter-chain secondary ligands, replacement of the primary ligands with the secondary ligands allowing the plurality of quantum dots to become sufficiently close-packed to facilitate charge transfer therebetween.

10. The method of claim 1, wherein the source and drain electrodes define a plurality of pixels, the layer of channel material is a continuous layer common to the plurality of pixels, and the source and drain electrodes are configured to inhibit a flow of electrical current between the plurality of pixels.

11. The method of claim 10, wherein the plurality of pixels have an enclosed-cell or interdigitated geometry.

12. The method of claim 1, wherein the source and drain electrodes define a plurality of pixels, the layer of channel material is a continuous layer common to the plurality of pixels, and the method comprises patterning the continuous layer of channel material to inhibit a flow of electrical current between the plurality of pixels.

13. An apparatus comprising a layer of channel material, source and drain electrodes positioned below the layer of channel material configured to enable a flow of electrical current through the layer of channel material, a layer of quantum dot material having a substantially uniform thickness across an area, the layer of quantum dot material formed by a deposit of a quantum dot solution onto the layer of channel material that is as-grown and by a transfer of the layers of channel and quantum dot material as a single stack onto a substrate, the layer of quantum dot material positioned on top of the layer of channel material configured to generate electron-hole pairs on exposure to incident electromagnetic radiation to produce a change in the flow of electrical current which is indicative of a presence and magnitude of the incident electromagnetic radiation, and the substrate configured to support the source and drain electrodes and the layers of channel and quantum dot material,
wherein both the layers of channel and quantum dot material substantially conform to the topography of the underlying substrate and electrodes, and
wherein the layer of quantum dot material has the substantially uniform thickness across the area of the layer of quantum dot material.

14. A method of using an apparatus,
the apparatus comprising a layer of channel material, source and drain electrodes positioned below the layer of channel material configured to enable a flow of electrical current through the layer of channel material, a layer of quantum dot material having a substantially uniform thickness across an area, the layer of quantum dot material formed by a deposit of a quantum dot solution onto the layer of channel material that is as-grown and by a transfer of the layers of channel and quantum dot material as a single stack onto a substrate, the layer of quantum dot material positioned on top of the layer of channel material configured to generate electron-hole pairs on exposure to incident electromagnetic radiation to produce a change in the flow of electrical current which is indicative of a presence and magnitude of the incident electromagnetic radiation, and the substrate configured to support the source and drain electrodes and the layers of channel and quantum dot material, wherein both the layers of channel and quantum dot material substantially conform to the topography of the underlying substrate and electrodes, and wherein the layer of quantum dot material has the substantially uniform thickness across the area of the layer of quantum dot material,
the method comprising determining the presence and magnitude of the incident electromagnetic radiation based on the change in the flow of electrical current through the layer of channel material.

15. A computer program comprising computer code configured to cause apparatus to perform:

depositing a quantum dot solution onto an as-grown layer of channel material to form a layer of quantum dot material having a substantially uniform thickness across the area of the layer of quantum dot material; and transferring the layers of channel and quantum dot material as a single stack onto a substrate comprising source and drain electrodes such that both the layers of channel and quantum dot material substantially conform to the topography of the underlying substrate and electrodes whilst maintaining the substantially uniform thickness of quantum dot material, the source and drain electrodes configured to enable a flow of electrical current through the layer of channel material, the layer of quantum dot material configured to generate electron-hole pairs on exposure to incident electromagnetic radiation to produce a detectable change in the flow of electrical current which is indicative of one or more of the presence and magnitude of the incident electromagnetic radiation.

* * * * *